United States Patent [19]
Tseng

[11] Patent Number: 5,915,177
[45] Date of Patent: Jun. 22, 1999

[54] EPROM MANUFACTURING PROCESS HAVING A FLOATING GATE WITH A LARGE SURFACE AREA

[75] Inventor: Horng-Huei Tseng, Hsinchu, Taiwan

[73] Assignee: Vanguard International Semiconductor Corporation, Hsin-Chu, Taiwan

[21] Appl. No.: 08/912,535

[22] Filed: Aug. 18, 1997

[51] Int. Cl.[6] .............................................. H01L 21/8247
[52] U.S. Cl. ........................................ 438/264; 438/594
[58] Field of Search ................................... 438/593, 594, 438/FOR 203, 305, 264

[56] References Cited

U.S. PATENT DOCUMENTS

| | | | |
|---|---|---|---|
| 4,892,840 | 1/1990 | Esquivel et al. | 438/262 |
| 5,141,891 | 8/1992 | Arima et al. | 438/307 |
| 5,270,234 | 12/1993 | Huang et al. | 438/305 |
| 5,489,543 | 2/1996 | Hong | 438/305 |
| 5,498,560 | 3/1996 | Sharma et al. | 438/305 |
| 5,512,505 | 4/1996 | Yaun et al. | 438/594 |
| 5,534,447 | 7/1996 | Hong | 438/305 |
| 5,543,339 | 8/1996 | Roth et al. | 438/265 |
| 5,583,066 | 12/1996 | Jung | 438/259 |
| 5,658,814 | 8/1997 | Lee | 438/593 |
| 5,670,401 | 9/1997 | Tseng | 438/305 |
| 5,677,216 | 10/1997 | Tseng | 438/594 |

*Primary Examiner*—Richard Booth
*Attorney, Agent, or Firm*—George O. Saile; Stephen B. Ackerman; William J. Stoffel

[57] ABSTRACT

The method for forming a "U" shaped floating gate 120a with high vertical projections 120c, begins by forming a dielectric layer 110 over the substrate 100. A photoresist layer 112 is then formed on the dielectric layer 110 *and patterned to form a first opening* 113. The first opening 113 exposes the dielectric layer 110. *In an important step, a polymer layer* 114 is formed over the photoresist layer 112 and on the vertical sidewalls of the first opening 113 thereby forming a second opening 115. The second opening 115 has a smaller width than that of the first opening 113. The dielectric layer 110 is anisotropically etched thru the second opening 115 thereby forming a third opening 116 in the dielectric layer 110. The photoresist layer 112 and the polymer layer 114 are now removed. The exposed substrate within the third opening 116 is thermally oxidized to form a tunnel oxide layer 118. A first polysilicon layer 120 is formed conformally on the resultant surface and in the third opening. The first polysilicon layer is chemically mechanically polished, thereby forming the U-shaped floating gate 120a in the third opening 116. An intergate dielectric layer 122 and a control gate 124A are then formed on the floating gate 120a to complete the EPROM.

10 Claims, 3 Drawing Sheets

EPROM MANUFACTURING PROCESS HAVING A FLOATING GATE WITH A LARGE SURFACE AREA

BACKGROUND OF THE INVENTION

1) Field of Invention

The present invention relates in general to non-volatile semiconductor memories, and more particularly relates to erasable read-only memory devices, and methods of fabrication thereof.

2) Description of Prior Art

A shortcoming of conventional EPROM cells is the low gate coupling ratio. Conventional electrically programmable read-only memory (EPROM) cells typically have control gates that overlie the top or the top and sides of floating gates. When a control gate overlies only the top of the floating gate member, the capacitive coupling between the floating gate member and control gate member typically does not exceed about 50% of the floating gate capacitance (i.e., capacitance ratio=50%). When a control gate lies adjacent to the top and sides of the floating gate the capacitance coupling ratio may increase to about 70%.

An attempt to increase capacitive coupling ratio may include the use of a control gate that lies adjacent to the top, sides, and part of the bottom of a T-shaped floating gate. The formation of this type of device is complex and may include two deposition steps and two patterning steps. Further, the intergate dielectric layer (between the control gate and the floating gate) may include two distinct regions, and its formation may require three steps. For example, one region may be between the bottom of the floating gate and an underlying portion of the control gate, and the other region may be between the top of the floating gate and an overlying portion of the control gate. Extra processing steps typically lower yield, raise substrate cost, increase cycle time, and are generally undesired.

A major shortcoming with conventional methods of forming floating gates is the low gate coupling ratios which reduce the bias in writing or programming in Flash EPROM's.

There is a need for an improved method of forming a floating gate with a higher gate coupling ratio. There is a need to form a gate with a larger surface area.

The most pertinent patents in the art are U.S. Pat. No. 5,141,891 (Arima et al.) and 4,892,840 (Esquival et al.) which show an EPROM with a "U" shaped floating and control gates. U.S. Pat. No. 5,543,339 (Roth et al.) shows a EPROM having U shaped electrode. U.S. Pat. No. 5,583,066 (Jung) shows a well shaped floating gate surrounding a control gate.

SUMMARY OF THE INVENTION

It is an objective of the present invention to provide a method of forming a flash EPROM floating gate and control gate with a large surface area.

It is another objective of the present invention to provide a method of forming a flash EPROM floating gate having a "U" shape with high vertical projections.

It is yet another objective of the present invention to provide a method of forming a flash EPROM floating gate with a high gate coupling ratio.

The invention begins by providing a semiconductor substrate 100. A dielectric layer 110 is then formed over the substrate 100. A photoresist layer 112 is then formed on the dielectric layer 110 and then the photoresist layer is patterned to form a first opening 113 in the photoresist layer with vertical sidewalls. The first opening 113 exposes the dielectric layer 110. The first opening 113 has a width that is the minimum dimension the photolithographic process is capable of.

In an important step, a polymer layer 114 is formed over the photoresist layer 112 and on the vertical sidewalls of the photoresist layer in the first opening 113 thereby forming a second opening 115. The second opening 115 has a smaller width than that of the first opening 113. The polymer layer 114 and the dielectric layer 110 are anisotropically etched thereby forming a third opening 116 with vertical sidewalls, in the dielectric layer 110. The third opening exposes the substrate 100. The photoresist layer 112 and the remaining portions of the polymer layer 114 are now removed. See FIG. 2.

The exposed substrate within the third opening 116 is thermally oxidized to form a tunnel oxide layer 118. A first polysilicon layer 120 is formed conformally on the dielectric layer 110, on the vertical sidewalls of the third opening 116, and on the tunnel oxide layer 118. The first polysilicon layer 120 over the dielectric layer is now removed to form the gate 120A. The first polysilicon layer 120 over the dielectric layer is preferably chemically mechanically polished removing the section of the first polysilicon layer 120 over the dielectric layer 110. The remaining first polysilicon layer 120a forms a U-shaped floating gate 120a inside the third opening 116 and on top of the tunnel oxide layer 118. The U shaped floating gate is comprised of a horizontal base 120b (over the tunnel oxide layer) and two vertical projections 120c (on the sidewalls of the dielectric layer). The dielectric layer is then removed. An intergate dielectric layer 122 is then formed conformally on the floating gate 120a and on the substrate 100. A second polysilicon layer 124 is formed conformally on the intergate dielectric layer 122. The second polysilicon layer 124 and the intergate dielectric layer 122 are patterned forming a control gate 124a. Spaced source and drain regions 130 are formed in the substrate 100 adjacent to the control gate 124a. Insulation layers 120 and conductive layers 150 are formed to connect devices to from an EPROM.

The present invention provides a method of forming a flash EPROM floating gate 120A having a "U" shape with high vertical projections 120c. The high vertical projections 120c increase the gate coupling ratio thereby increasing the bias in writing or programming in Flash EPROM. The invention provides a floating gate 120a with a large surface area using a easy to manufacture process.

An important feature of the present invention is the photoresist process with the polymer layer 114 which allows the formation of a floating gate that is smaller than possible when using conventional photolithographic processes. The unique U shape floating gate 120a having high vertical projections 120c, provides increased surface area and increased capacitance coupling between the floating gate 120a and the control gate 124a for the Flash EPROM memory cell.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

Figure 1:
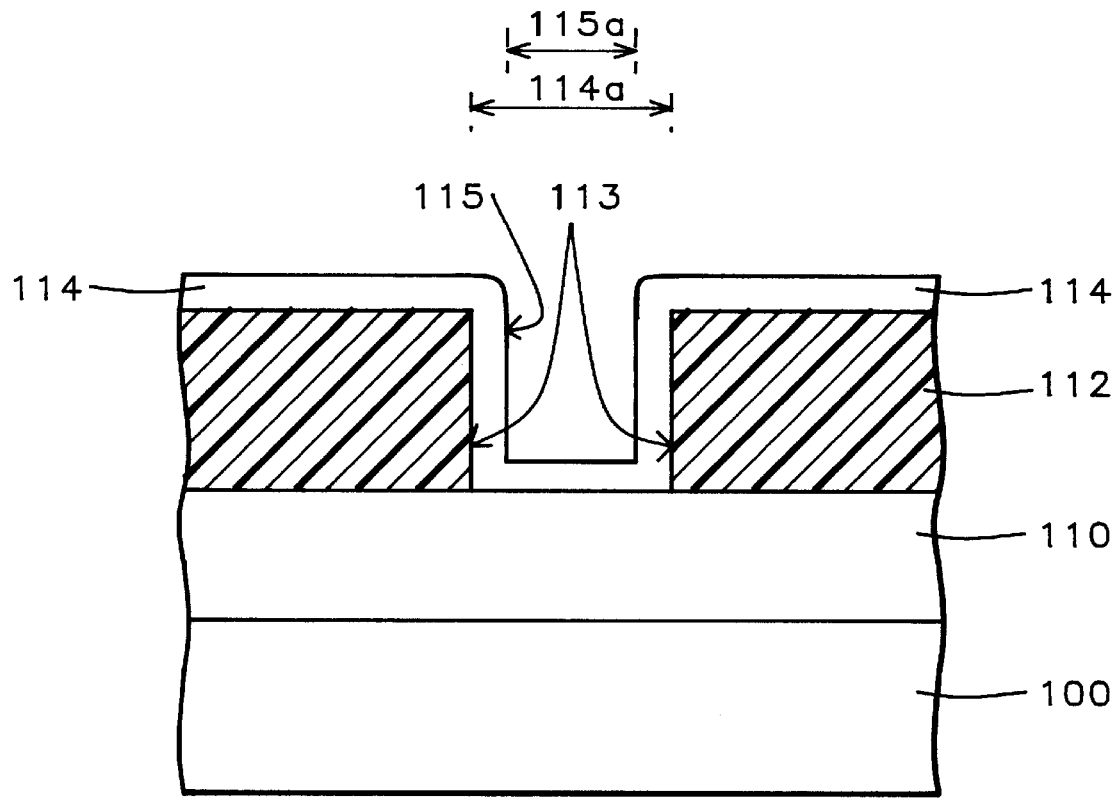
FIGS. 1 through 7 schematically illustrate in cross-sectional representation a preferred embodiment of the method of forming a floating gate according to the present invention.

As shown in FIG. 1, the invention begins by providing a semiconductor substrate 100. A dielectric layer 110 is then formed over the substrate 100. The dielectric layer is preferably composed of silicon oxide having a thickness of between about 1000 and 5000 Å, and more preferably between 2500 and 3500Å and most preferably about 3000 Å.

In a preferred method, a borophosphosilicate glass (BPSG)/nitride bi-layer (not shown) is formed over the dielectric layer 110. The nitride layer of the bi-layer is used as a chemical-mechanical polish (CMP) stopping layer in a subsequent CMP step explained below.

A photoresist layer 112 is then formed on the dielectric layer 110. The photoresist layer 112 is then patterned by a conventional photolithographic process to form a first opening 113 in the photoresist layer with vertical sidewalls. The etch also exposes the dielectric layer 110. The first opening 113 has a width that is the minimum dimension allowed by the photolithographic process. The width of the first opening 113 is between about 0.1 and 0.5 μm and more preferably 0.2 to 0.3 μm.

A polymer layer 114 is then formed over the photoresist layer 112 and on the vertical sidewalls of the first opening 113 thereby forming a second opening 115. The second opening 115 has a smaller open dimension (width) than that of the first opening 113. The polymer layer 114 has a thickness of between about 300 and 1000 Å and more preferably between about 400 and 600 Å and most preferably about 500 Å.

The polymer layer is preferably composed of C, H, O and Si. The non-volatile organic polymer is preferably formed by a reaction of the plasma etching gas and the photoresist.

The second opening preferably has a open dimension (e.g., width) of between about 0.05 and 0.4 μm and more preferably between about 0.2 and 0.3 μm and most preferably 0.25 μm.

Figure 2:
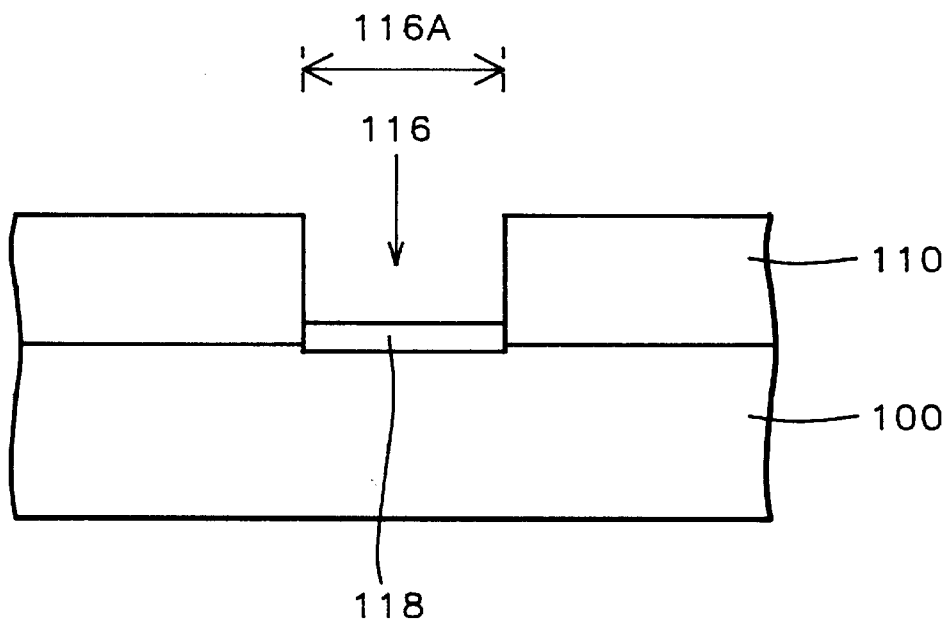

Now referring to FIGS. 1 & 2, the polymer layer 114 and the dielectric layer 110 are anisotropically etched thereby forming a third opening 116 with vertical sidewalls, in the dielectric layer 110. The third opening 116 exposes the substrate 100. The anisotropic etch is preferably MERIE (Magnetic enhance Reactive Ion Etching) preferably using etch gases comprising $CHF_3$, $O_2$ and Ar.

The third opening 116 preferably has an open dimension (e.g., width) 116A of between about 0.05 and 0.4 μm and more preferably between 0.2 and 0.3 μm and most preferably about 0.25 μm. The width of the third opening 116 is preferably about the same as the width of the second opening 113.

The photoresist layer 112 and the remaining portions of the polymer layer 114 are now removed.

Still referring to FIG. 2, the substrate exposed within the third opening 116 is thermally oxidized to form a tunnel oxide layer 118. The tunnel oxide layer 118 having a thickness of between about 50 and 200 Å and more preferably 100 Å.

Figure 3:
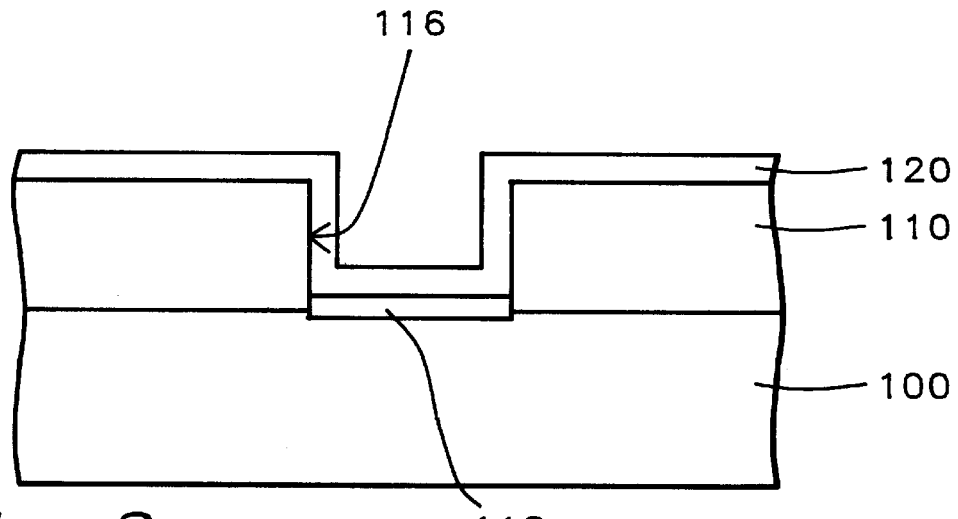

As shown in FIG. 3, the first polysilicon layer 120 is formed conformally on the dielectric layer 110, the vertical sidewalls of the third opening 116, and on the tunnel oxide layer 118. The first polysilicon layer 120 is preferably formed by depositing polysilicon by LPCVD (low pressure chemical vapor deposition) to a thickness of between about 500 and 1500 Å. This layer preferably can be doped by an in-situ LPCVD process using a reaction gas of $SiH_4$, $PH_3$ and $N_2$, and at a temperature in a range of between about 500 and 650° C., and more preferably about 575° C.

Figure 4:
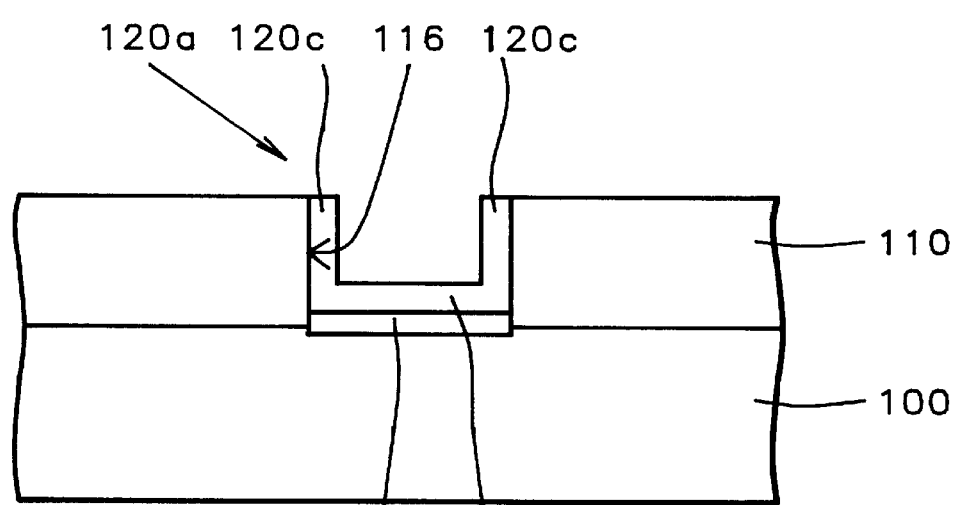
Figure 5:
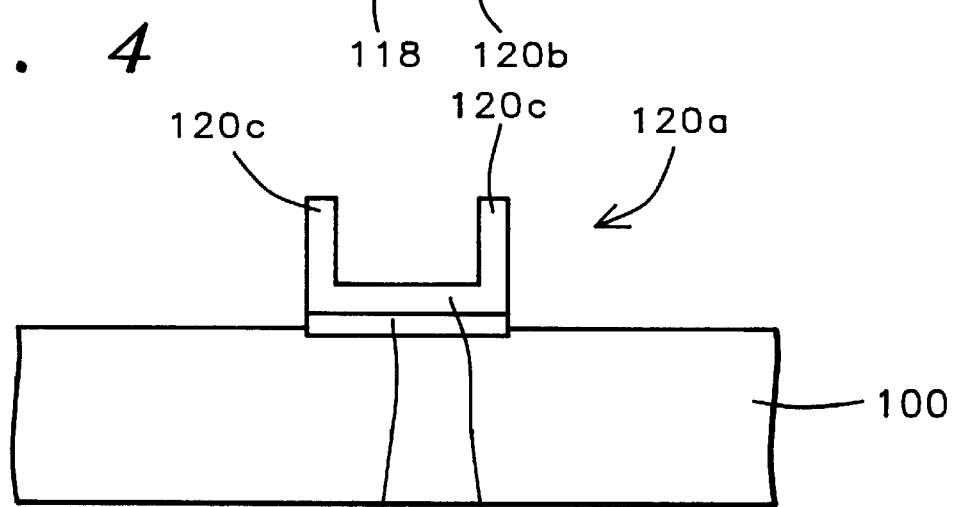

Now referring to FIG. 4, the first polysilicon layer 120 over the dielectric layer is removed to form the gate 120A. The first polysilicon layer 120 is preferably chemically mechanically polished removing a portion of polysilicon layer 120 over the dielectric layer 110. The remaining polysilicon layer 120a forms a U-shaped floating gate 120a, having two vertical projections 120c inside the third opening 116 and a horizontal base 120b on top of the tunnel oxide layer 118. The vertical projections 120c preferably have a height of between about 1000 and 5000 Å, and more preferably between about 2500 and 3500 Å.

If the BPSG/nitride CMP stopping bi-layer (not shown but discussed above) was formed over the dielectric layer 110, the bi-layer would be used as the chemical mechanical polishing stopping layer The dielectric layer 110 (and any remaining portion of the silicon nitride bi-layer if present) are removed preferably by a selective etch. The preferred selective etch is composed of a HF solution or dilute HF.

Figure 6:
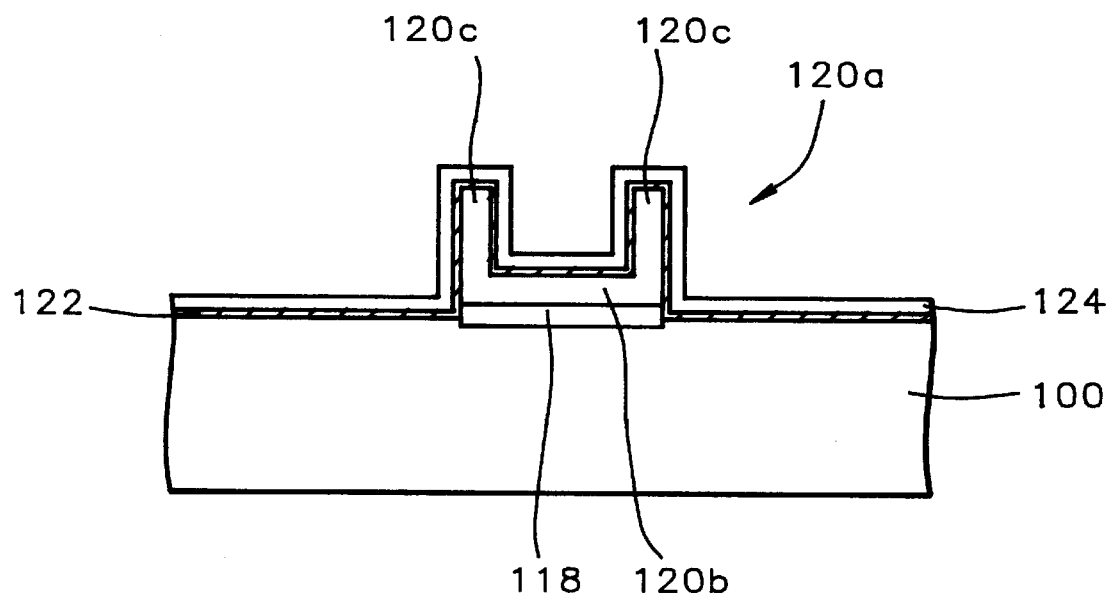

Referring to FIG. 6, an intergate dielectric layer 122 is formed conformally on the floating gate 120a and on the substrate 100. The intergate dielectric layer 122 has a thickness of between about 50 and 200 Å. The intergate dielectric layer 122 is preferably formed ONO (oxide layer / nitride layer Oxide layer).

A second polysilicon layer 124 is formed conformally on the intergate dielectric layer 122. The second polysilicon layer 124 has a thickness of between about 1000 and 2000 Å.

Figure 7:
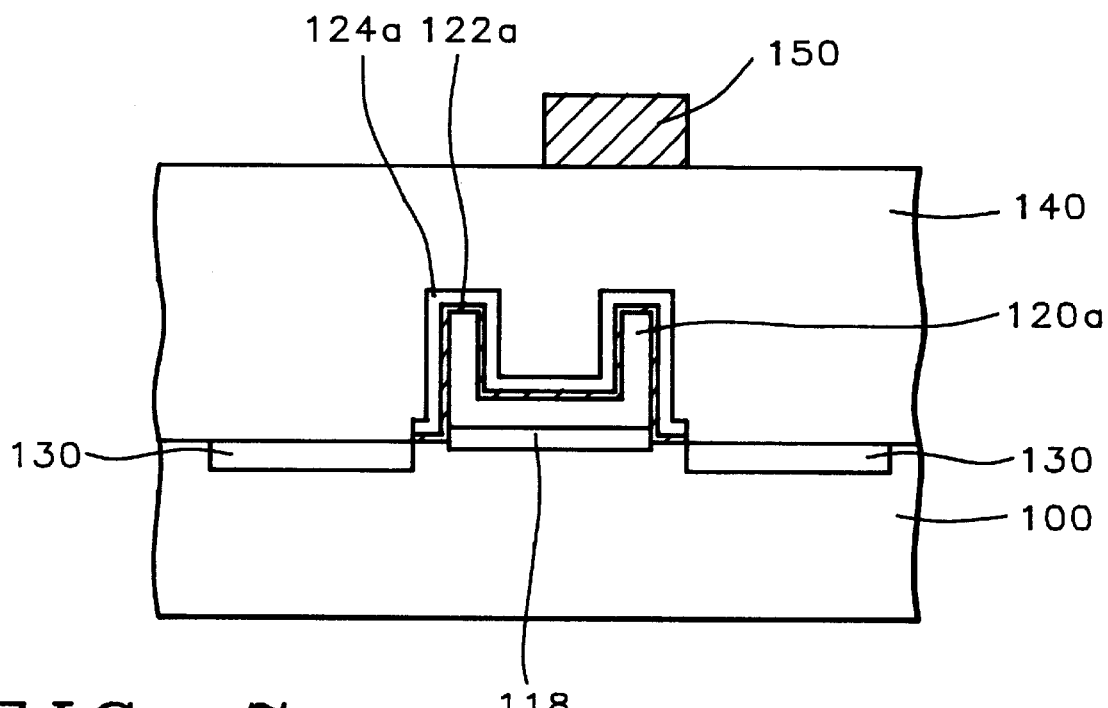

Now referring to FIG. 7, the second polysilicon layer 124 and the intergate dielectric layer 122 are patterned forming a control gate 124a. The patterned intergate dielectric layer is labeled 122a in FIG. 7.

The memory cell is then completed using conventional processes. For example, spaced source and drain regions 130 are formed in the substrate 100 adjacent to the control gate 124a. Then the second dielectric layer 140 is formed over the substrate, source and drain regions and the control gate 120a. A metal layer 150 is then formed over the second dielectric layer 140, thereby forming a memory cell. The metal layer 150 and other conductive layers (not shown) connect up elements to form the EPROM.

The present invention provides a method of forming a flash EPROM floating gate 120A having a "U" shape with high vertical projections 120c. The high vertical projections 120c increase the gate coupling ratio thereby increasing the bias in writing or programming in Flash EPROM.

An important feature of the present invention is the photoresist process with the polymer layer 114 which allows the formation of a floating gate that is smaller than possible when using conventional photolithographic processes. The unique U shape floating gate 120a having high vertical projections 120c, provides increased surface area and increased capacitance coupling between the floating gate 120a and the control gate 124a for the Flash EPROM memory cell. The invention provides a floating gate 120a with a large surface area using a easy to manufacture process.

What is claimed is:

1. A method of forming a floating gate in the fabrication of a semiconductor device and on a semiconductor substrate, comprising the steps of:
 a) forming a dielectric layer on said semiconductor substrate;
 b) forming a photoresist layer on said dielectric layer, and patterning said photoresist layer, to form a first opening with vertical sidewalls through said photoresist layer, the first opening exposing said dielectric layer;
 c) forming a polymer layer over said photoresist layer and on said vertical sidewalls of said photoresist in said first opening thereby forming a second opening smaller than said first opening;
 d) anisotropically etching said polymer layer and said dielectric layer through said second opening and leaving remaining portions of said polymer layer thereby forming a third opening with vertical sidewalls in said dielectric layer and exposing a surface of said substrate;
 e) removing said photoresist layer and said remaining portions of said polymer layer;
 f) thermally oxidizing the exposed substrate surface thereby forming a tunnel oxide layer on said substrate surface;
 g) forming a first polysilicon layer conformally on said dielectric layer and on said vertical sidewalls of said third opening in said dielectric layer and on said tunnel oxide layer;
 h) chemical mechanical polishing said first polysilicon layer thereby removing a portion of said polysilicon layer over said dielectric layer and leaving a remaining portion inside the third opening; the remaining portion of said first polysilicon layer inside the third opening forming a floating gate on said tunnel oxide layer, said floating gate having a U-shape comprising a horizontal base and two vertical projections;
 i) removing said dielectric layer;
 j) forming an intergate dielectric layer conformally on said substrate and on said floating gate;
 k) forming a second polysilicon layer conformally on said intergate dielectric layer;
 l) patterning said second polysilicon layer and said intergate dielectric layer forming a control gate from said second polysilicon layer; and
 m) forming spaced source and drain regions in said substrate adjacent to said control gate.

2. The method of claim 1 wherein said dielectric layer has a thickness in a range of between about 2500 and 3500 Å.

3. The method of claim 1 wherein the width of said first opening is between about 0.2 to 0.3 μm.

4. The method of claim 1 wherein said polymer layer has a thickness of between about 400 and 600 Å.

5. The method of claim 1 wherein said third opening has an open dimension of between about 0.2 and 0.3 μm.

6. The method of claim 1 wherein said first polysilicon layer has a thickness in a range of between about 500 and 1500 Å.

7. The method of claim 1 wherein said intergate dielectric layer has a thickness of between about 50 and 200 Å.

8. The method of claim 1 wherein said second polysilicon layer has a thickness of between about 1000 and 2000 Å.

9. The method of claim 1 wherein said vertical projections have a height of between about 2500 and 3500 Å.

10. A method of manufacturing an EPROM device having a floating gate on a semiconductor substrate, said method comprising the steps of:
 a) forming a dielectric layer on said semiconductor substrate; said dielectric layer having a thickness between about 2500 and 3500 Å;
 b) forming a photoresist layer on said dielectric layer;
 c) patterning said photoresist layer using a photolithographic exposing, developing, and etching process to form a first opening in said photoresist layer with vertical sidewalls, said first opening exposing said dielectric layer; said first opening having an open dimension between about 0.2 to 0.3 μm;
 d) forming a polymer layer over said photoresist layer and on said vertical sidewalls of said first opening thereby forming a second opening smaller than said first opening; said polymer layer having a thickness of between about 400 and 600 Å;
 e) anisotropically etching said polymer layer and said dielectric layer through said second opening and leaving remaining portions of said polymer layer thereby forming a third opening with vertical sidewalls in said dielectric layer and exposing a surface of said substrate;
 f) removing said photoresist layer and said remaining portions of said polymer layer;
 g) thermally oxidizing the exposed substrate surface forming a tunnel oxide layer;
 h) forming a first polysilicon layer conformally on said dielectric layer and on said vertical sidewalls of said third opening and on said tunnel oxide layer; said first polysilicon layer having a thickness in a range of between about 500 and 1500 Å;
 i) chemical mechanical polishing said first polysilicon layer thereby removing a portion of said polysilicon layer over said dielectric layer and leaving a remaining portion inside the third opening; the remaining portion of said first polysilicon layer inside the third opening forming a floating gate on said tunnel oxide layer, said floating gate having a U-shape comprised of a horizontal base and two vertical projections; said vertical projections having a height of between about 2500 and 3500 Å;
 j) removing said dielectric layer;
 k) forming an intergate dielectric layer conformally on said substrate and on said floating gate;
 l) forming a second polysilicon layer conformally on said intergate dielectric layer; said second polysilicon layer having a thickness of between about 1000 and 2000 Å;
 m) patterning said second polysilicon layer and said intergate dielectric layer to form a control gate from said second polysilicon layer; and
 n) forming spaced source and drain regions in said substrate adjacent to said control gate thereby completing said EPROM device.

* * * * *